(12) United States Patent
Kline

(10) Patent No.: US 6,815,712 B1
(45) Date of Patent: Nov. 9, 2004

(54) METHOD FOR SELECTING COMPONENTS FOR A MATCHED SET FROM A WAFER-INTERPOSER ASSEMBLY

(75) Inventor: Jerry D. Kline, Argyle, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 0 days.

(21) Appl. No.: 09/678,163

(22) Filed: Oct. 2, 2000

(51) Int. Cl.[7] ............................................. H01L 23/58
(52) U.S. Cl. ........................... 257/48; 257/686; 438/14; 438/15; 438/106; 438/107
(58) Field of Search ........................... 438/14, 15, 106, 438/107, 480, 108, 113, 615–617; 257/48, 686; 324/754, 755, 757

(56) References Cited

U.S. PATENT DOCUMENTS

| | | |
|---|---|---|
| 3,939,558 A | 2/1976 | Riley |
| 4,577,214 A | 3/1986 | Schaper |
| 4,617,730 A | 10/1986 | Geldermans et al. |
| 4,628,411 A | 12/1986 | Balceres et al. |
| 4,688,151 A | 8/1987 | Kraus et al. |
| 4,868,712 A | 9/1989 | Woodman |
| 4,998,885 A | 3/1991 | Beaman |
| 5,016,138 A | 5/1991 | Woodman |
| 5,060,052 A | 10/1991 | Casto et al. |
| 5,065,227 A | 11/1991 | Frankeny |
| 5,086,558 A | 2/1992 | Grube et al. |
| 5,123,850 A | 6/1992 | Elder et al. |
| 5,132,613 A | 7/1992 | Papae et al. |
| 5,148,265 A | 9/1992 | Khandros et al. |
| 5,148,266 A | 9/1992 | Khandros et al. |
| 5,309,021 A | 5/1994 | Shimamoto et al. |
| 5,327,325 A | 7/1994 | Nicewarner, Jr. |
| 5,347,159 A | 9/1994 | Khandros et al. |
| 5,347,162 A | 9/1994 | Pasch |
| 5,371,654 A | 12/1994 | Beaman et al. |
| 5,382,898 A | 1/1995 | Subramanian |
| 5,384,691 A | 1/1995 | Beugebauer et al. |
| 5,399,505 A | 3/1995 | Dasse et al. |
| 5,399,898 A | 3/1995 | Rostoker |
| 5,410,259 A | 4/1995 | Fujihara et al. |
| 5,476,211 A | 12/1995 | Khandros |
| 5,477,160 A | 12/1995 | Love |
| 5,483,421 A | 1/1996 | Gedney et al. |
| 5,489,804 A | 2/1996 | Pasch |
| 5,491,612 A | 2/1996 | Nicewarner, Jr. |
| 5,497,079 A | 3/1996 | Yamada et al. |
| 5,504,369 A | 4/1996 | Dasse et al. |
| 5,517,515 A | 5/1996 | Spall et al. |
| 5,518,964 A | 5/1996 | DiStefano et al. |
| 5,531,022 A | 7/1996 | Beaman et al. |
| 5,532,612 A | 7/1996 | Liang |
| 5,544,017 A | 8/1996 | Beilin et al. |
| 5,570,032 A | 10/1996 | Atkins et al. |
| 5,579,207 A | 11/1996 | Hayden et al. |

(List continued on next page.)

Primary Examiner—Hsien Ming Lee
(74) Attorney, Agent, or Firm—Lawrence R. Youst; Danamraj & Youst, P.C.

(57) ABSTRACT

A matched set of integrated circuit chips (24) and a method for assembling such integrated circuit chips (24) into a matched set are disclosed. A semiconductor wafer (18) having a plurality of integrated circuit chips (24) is electrically and mechanically coupled to a wafer interposer (12) to form a wafer-interposer assembly (10). The integrated circuit chips (24) of the wafer (18) are then tested together by attaching the wafer-interposer assembly (10) to a testing apparatus and running the integrated circuit chips (24) through various testing sequences. The wafer-interposer assembly (10) is then diced into a plurality of chip assemblies each having a chip (24) and a section of the wafer interposer (12). Based upon the testing, the chip assemblies are sorted and at least two of the chip assemblies are selected for inclusion in the matched set.

38 Claims, 5 Drawing Sheets

U.S. PATENT DOCUMENTS

| | | | |
|---|---|---|---|
| 5,594,273 | A | 1/1997 | Dasse et al. |
| 5,600,257 | A | 2/1997 | Leas et al. |
| 5,600,541 | A | 2/1997 | Bone et al. |
| 5,612,575 | A | 3/1997 | DeGimy |
| 5,615,089 | A | 3/1997 | Yoneda et al. |
| 5,635,010 | A | 6/1997 | Pepe et al. |
| 5,637,920 | A | 6/1997 | Loo |
| 5,654,588 | A | 8/1997 | Dasse et al. |
| 5,655,290 | A | 8/1997 | Moresco et al. |
| 5,685,885 | A | 11/1997 | Khandros et al. |
| 5,701,666 | A | 12/1997 | DeHaven et al. |
| 5,759,047 | A | 6/1998 | Brodsky et al. |
| 5,764,071 | A | 6/1998 | Chan et al. |
| 5,789,807 | A | 8/1998 | Correale, Jr. |
| 5,794,175 | A | 8/1998 | Conner |
| 5,796,746 | A | 8/1998 | Farnworth et al. |
| 5,798,652 | A | 8/1998 | Traci |
| 5,800,184 | A | 9/1998 | Lopergolo et al. |
| 5,802,713 | A | 9/1998 | Deamer |
| 5,806,181 | A | 9/1998 | Khandros et al. |
| 5,832,601 | A | 11/1998 | Eldridge et al. |
| 5,834,946 | A | 11/1998 | Albrow et al. |
| 5,838,060 | A | 11/1998 | Comer |
| 5,838,072 | A | 11/1998 | Li et al. |
| 5,844,803 | A | 12/1998 | Beffa |
| 5,848,467 | A | 12/1998 | Khandros et al. |
| 5,854,507 | A | 12/1998 | Miremadi et al. |
| 5,878,486 | A | 3/1999 | Eldridge et al. |
| 5,885,849 | A | 3/1999 | DiStefano et al. |
| 5,892,287 | A | 4/1999 | Hoffman et al. |
| 5,897,326 | A | 4/1999 | Eldridge et al. |
| 5,900,738 | A | 5/1999 | Khandros et al. |
| 5,905,382 | A | 5/1999 | Wood et al. |
| 5,915,752 | A | 6/1999 | DiStefano et al. |
| 5,927,193 | A | 7/1999 | Balz et al. |
| 5,929,651 | A | 7/1999 | Leas et al. |
| 5,936,847 | A | 8/1999 | Kazle |
| 5,942,246 | A | 8/1999 | Mayhew et al. |
| 5,943,213 | A | 8/1999 | Sasov |
| 5,949,246 | A | 9/1999 | Frankeny et al. |
| 5,950,070 | A | 9/1999 | Razon et al. |
| 5,950,304 | A | 9/1999 | Khandros et al. |
| 5,959,462 | A | 9/1999 | Lum |
| 5,977,640 | A | 11/1999 | Bertin et al. |
| 5,984,691 | A | 11/1999 | Brodsky et al. |
| 5,994,168 | A | 11/1999 | Egawa |
| 6,002,178 | A | 12/1999 | Lin |
| 6,020,220 | A | 2/2000 | Gilleo et al. |
| 6,024,275 | A | 2/2000 | Takiar |
| 6,032,356 | A | 3/2000 | Eldridge et al. |
| 6,034,332 | A | 3/2000 | Moresco et al. |
| 6,046,600 | A | 4/2000 | Whetsel |
| 6,049,467 | A | 4/2000 | Tamarkin et al. |
| 6,050,829 | A | 4/2000 | Eldridge et al. |
| 6,053,395 | A | 4/2000 | Sasaki |
| 6,064,213 | A | 5/2000 | Khandros et al. |
| 6,069,026 | A | 5/2000 | Terrill et al. |
| 6,080,264 | A | 6/2000 | Ball |
| 6,080,494 | A | 6/2000 | Abbott |
| 6,082,610 | A | 7/2000 | Shangguan et al. |
| 6,083,773 | A | 7/2000 | Lake |
| 6,098,278 | A | 8/2000 | Vindasius et al. |
| 6,101,100 | A | 8/2000 | Londa |
| 6,104,202 | A | 8/2000 | Slocum et al. |
| 6,133,070 | A | 10/2000 | Yagi et al. |
| 6,136,681 | A * | 10/2000 | Razon et al. .............. 438/617 |
| 6,137,299 | A | 10/2000 | Cadieux et al. |
| 6,147,400 | A | 11/2000 | Faraci et al. |
| 6,154,371 | A | 11/2000 | Oba et al. |
| 6,218,910 | B1 | 4/2001 | Miller |
| 6,242,279 | B1 | 6/2001 | Ho et al. |
| 6,242,932 | B1 | 6/2001 | Hembree |
| 6,246,247 | B1 | 6/2001 | Eldridge et al. |
| 6,258,627 | B1 | 7/2001 | Benenati et al. |
| 6,275,051 | B1 | 8/2001 | Bachelder et al. |
| 6,281,046 | B1 * | 8/2001 | Lam .......................... 438/113 |
| 6,303,992 | B1 | 10/2001 | Van Pham et al. |
| 6,313,522 | B1 | 11/2001 | Akram et al. |
| 6,319,829 | B1 | 11/2001 | Pasco et al. |
| 6,372,527 | B1 * | 4/2002 | Khandros et al. ............. 438/15 |
| 6,372,547 | B2 | 4/2002 | Nakamura et al. |
| 6,372,548 | B2 | 4/2002 | Bessho et al. |
| 6,392,428 | B1 * | 5/2002 | Kline et al. ................. 324/755 |
| 6,432,744 | B1 | 8/2002 | Amador et al. |
| 6,440,771 | B1 | 8/2002 | Pierce |
| 6,483,043 | B1 * | 11/2002 | Kline ........................ 174/262 |
| 6,483,330 | B1 * | 11/2002 | Kline ........................ 324/754 |
| 6,524,885 | B2 | 2/2003 | Pierce |
| 6,529,022 | B2 | 3/2003 | Pierce |
| 6,537,831 | B1 * | 3/2003 | Kline ........................ 438/14 |

* cited by examiner

METHOD FOR SELECTING COMPONENTS FOR A MATCHED SET FROM A WAFER-INTERPOSER ASSEMBLY

TECHNICAL FIELD OF THE INVENTION

This invention relates in general to integrated circuits and, more particularly, to wafer level testing of chips from a wafer that is coupled to an interposer for the selection of components for a matched set.

BACKGROUND OF THE INVENTION

Modern electronic devices utilize semiconductor chips, commonly referred to as integrated circuits, which incorporate numerous electronic elements. These chips are mounted on substrates which physically support the chips and electrically interconnect the chips with other elements of the circuit. Such substrates may then be secured to an external circuit board or chassis.

The size of the chips and substrate assembly is a major concern in modern electronic product design. The size of each subassembly influences the size of the overall electronic device. Moreover, the size of each subassembly controls the required distance between each chip and between chips and other elements of the circuit. Delays in transmission of electrical signals between chips are directly related to these distances. These delays limit the speed of operation of the device. Thus, more compact interconnection assemblies, with smaller distances between chips and smaller signal transmission delays, can permit faster operations.

One approach for improving overall system performance is through the use of matched sets. For example, several identical or dissimilar components that have been identified by the individual testing phase of component processing to have certain performance tracking characteristics may be assembled together as a matched set. The components of such a matched sets are frequently attached to a single substrate in close proximity to one another. This strategy improves performance compared to conventional or non-optimized systems by reducing the overall space needed to accommodate the chips and by, among other things, shortening the distance between chips. Specifically, interconnect inductance and signal transmission delays are all reduced.

One type of matched set includes a collection of identical components which have been identified to meet specific system performance requirements. For example, radio frequency (RF) systems often employ identical filters, switches, power dividers, mixers and high frequency amplifiers. Typically, each of the identical components has been extensively tested individually prior to inclusion in this type of system. The individual characterization tests for a filter, for instance, might measure insertion loss and phase shift as a function of frequency, input power and temperature. These multi-dimensional arrays of data are then compared to each other to identify individual components that perform within acceptable limits relative to each other. Components that are found to exhibit similar behavior under the various input stimuli will constitute a matched set of identical devices. Conversely, components that are found to exhibit dissimilar behavior under the various input stimuli, for example, the gain of one component having a negative slope over temperature while the gain of another component having a positive slope over temperature, will constitute a mismatch of components that will not be placed in a chip collection.

It has been found, however, the certain mismatches are not identified when the components are tested individually. In fact, certain mismatches are not identified until the entire chip collection is assembled and the components are tested together for the first time. As such, some chip collections must be disassembled so that the valuable components may be, for example, packaged as individual components, while other chip collections are simple discarded.

Therefore, a need has arisen for an improved method for selection of system components for a matched set. A need has also arisen for such a method that does not require elaborate data reduction of test results from individually tested components. Additionally, a need has arisen for such a method that allows for testing of the individual components together prior to the assembly of the matched set.

SUMMARY OF THE INVENTION

The present invention disclosed herein provides a chip collection, known as a matched set, that maximizes system performance by selecting well matched integrated circuit chips for assembly together into the matched set. The present invention achieves this result by allowing for testing of the various integrated circuit chips together prior to the assembly of the matched set. This testing is performed by connecting a wafer level interposer and a wafer to a testing apparatus. Thus, all of the chips to be included in the matched set may be tested together. After testing, the wafer-interposer assembly is diced into a plurality of chip assemblies that are assembled into the matched set.

In its broadest form, the present invention provides for the attachment of a semiconductor wafer having a plurality of integrated circuit chips thereon to an interposer for testing of the integrated circuit chips. The integrated circuit chips of the wafer may be, for example, DRAM chips, SRAM chips, amplifiers, controllers, converters or other devices that are commonly assembled in sets. Likewise, the integrated circuit chips of the wafer may be designed to carry any type of signal such as an analog signals, a digital signal, an RF signal or a mixed signal and the like.

Prior to testing, the wafer is electrically and mechanically coupling to the interposer such that the wafer-interposer assembly may be connected to a testing apparatus. The testing may include performance tests over a range of temperatures, including burn-in testing, vibration testing, testing for leakage currents, testing for offset voltages, testing for gain tracking, testing for bandwidth and the like to determine which integrated circuit chips from the wafer could be included in a matched set with other integrated circuit chips from that wafer to achieve optimum performance. Likewise, the testing may include grading of the integrated circuit chips for speed or other performance characteristics such that the integrated circuit chips that receive a particular grade are matched with other integrated circuit chips from that wafer having a similar grade. Additionally, the testing may include testing for non-conformance wherein certain integrated circuit chips may not be matched with any other integrated circuit chips from that wafer.

Once testing is complete, the wafer-interposer assembly may be diced into a plurality of chip assemblies. Two or more of these chip assemblies may them be matched with one another, for inclusion in a matched set. This selection is based upon the results of the testing of the integrated circuit chips. Using this process, all or substantially all of the integrated circuit chips from the wafer may be matched with other integrated circuit chips from that wafer based upon the desired performance characteristics of the matched set that will contain these devices. By performing the testing prior to assembly of the matched set, the performance characteristics of each of the matched sets assembled using integrated circuit chips from the tested wafer is enhanced as is the overall performance of the entire lot of matched set devices.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not define the scope of the invention.

Figure 1:
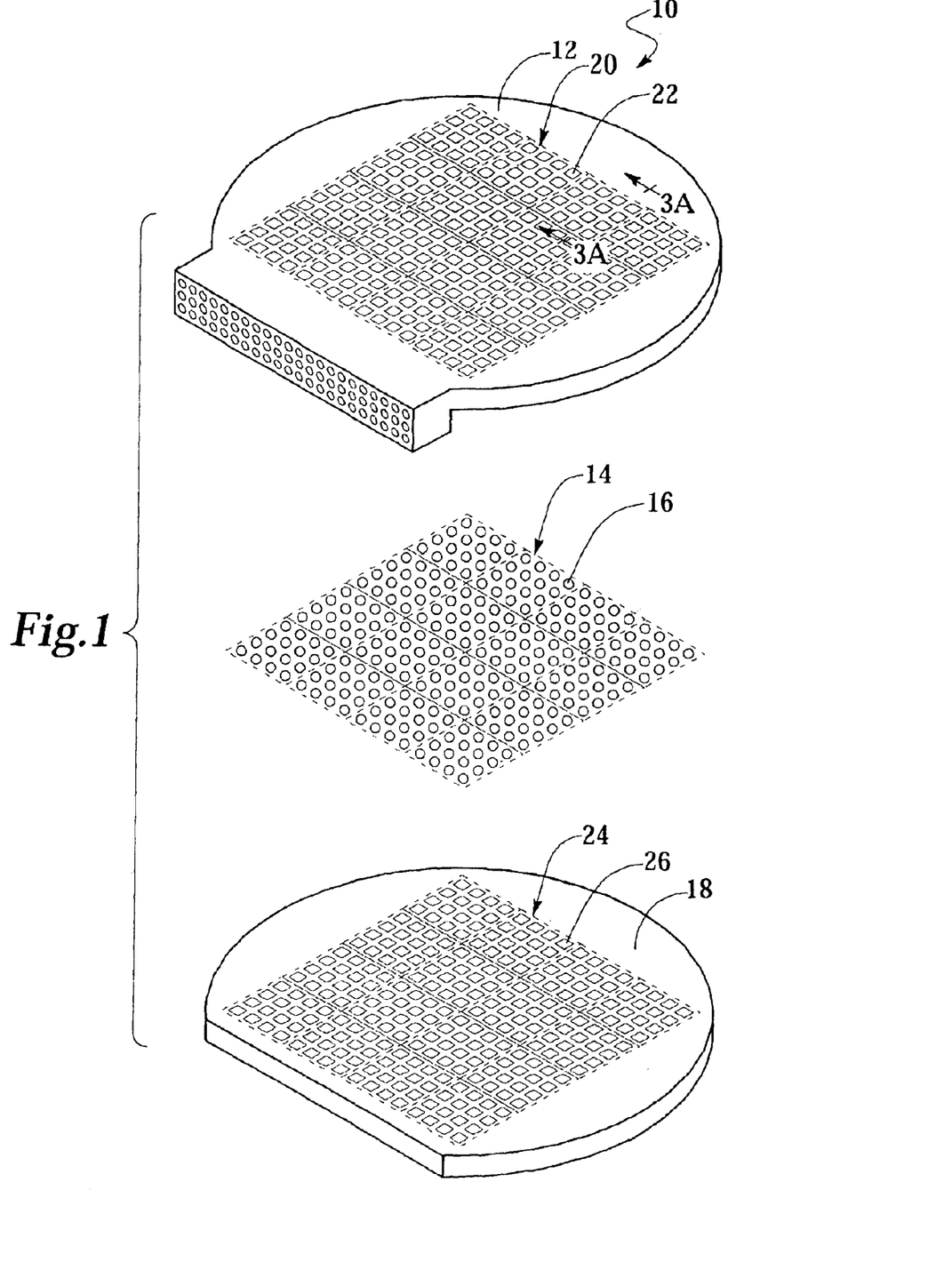
FIG. 1 is an exploded view of a wafer-interposer assembly of the present invention including a wafer having a plurality of chips.

The general features of a wafer-interposer assembly of the present invention is shown in FIG. 1 and are generally designated 10. Wafer-interposer assembly 10 includes a wafer interposer 12, an array 14 of conductive attachment elements 16 and a wafer 18. Interposer 12 has an array 20 of conductive contact pads 22 on the upper surface thereof. Array 20 is split into sixteen sections separated by dotted lines. The dotted lines represent the locations where interposer 12 will be cut when interposer 12 is diced into chip assemblies, including a section of interposer 12 and an associated chip from wafer 18, as will be described in more detail below. It should be noted that while array 20 of interposer 12 is depicted as having sixteen sections in FIG. 1, this depiction is for simplicity and clarity of description as those skilled in the art will recognize that actual interposers will have several hundred or several thousand sections which correspond to the several hundred or several thousand chips on typical wafers.

Each of the sixteen sections of array 20 has sixteen contact pads 22 depicted therein. The contact pads 22 represent the locations where interposer 12 will be electrically connected to a substrate once interposer 12 has been diced into chip assemblies, as will be described in more detail below. It should be noted that while array 20 is depicted as having sixteen contact pads 22 in each section in FIG. 1, this depiction is for simplicity and clarity of description as those skilled in the art will recognize that the actual number of contact pads 22 in each section will be several hundred or several thousand contact pads.

On the lower surface of interposer 12 there is an array of conductive contact pads (not pictured). In the illustrated embodiment, the contact pads on the lower surface of interposer 12 have the same geometry as contact pads 22. The contact pads on the lower surface of interposer 12 represent the locations where interposer 12 will be electrically connected to wafer 18, as will be described in more detail below. It should be noted that directional terms, such as above, below, upper, lower, etc., are used for convenience in referring to the accompanying drawings as it is to be understood that the various embodiments of the present invention described herein may be utilized in various orientations, such as inclined, inverted, horizontal, vertical, etc., without departing from the principles of the present invention.

Array 14 of conductive attachment elements 16 is split into sixteen sections separated by dotted lines. Each of the sections has sixteen conductive attachment elements 16 that correspond to the contact pads on the lower surface of interposer 12. Conductive attachment elements 16 may be in the shape of balls, bumps, columns and the like. Conductive attachment elements 16 may be formed from any suitable electrically conductive mater al such as solder, including tin based solder, gold based solder, zinc based solder, indium based solder and the like. Alternatively, conductive attachment elements 16 may be formed from a conductive epoxy, a conductive polymer or the like. Conductive attachment elements 16 may be attached to interposer 12 by any number of attachment techniques including screening, flowing, molding, reflowing, dipping, electroplating, adhering and the like, depending upon which material is used for conductive attachment elements 16.

Wafer 18 has a plurality of chips 24 depicted thereon having dotted lines therebetween that represent the locations where wafer 18 will be cut when wafer 18 is diced into chip assemblies, as will be described in more detail below. Wafer 18 is depicted as having sixteen chips 24. This depiction is for simplicity and clarity of description as those skilled in the art will recognize that actual number of chips 24 on wafer 18 will be several hundred or several thousand.

Each chip 24 has a plurality of conductive contact pads 26 on its face. Each chip 24 is depicted as having sixteen contact pads 26, for simplicity and clarity of description, which correspond with one of the conductive attachment elements 16 in array 14 and represent the locations where chips 24 will be electrically connected to interposer 12. It should be noted by those skilled in the art that the actual number of contact pads 26 on each chip 24 will be several hundred or several thousand instead of sixteen.

After assembly, conductive attachment elements 16 of array 14 electrically connect and mechanically bond contact pads 26 of each chip 24 to the facing contact pads on the lower surface of interposer 12. These permanent electrical and mechanical connections may be achieved using, for example, a heating method such as reflowing or thermal compression.

Wafer-interposer assembly 10 allows for the simultaneous testing of groups of chips 24 or all of the chips 24 of wafer 18. Simultaneous testing provides added efficiency to the testing process as numerous aspects of the functionality and performance of chips 24 may be tested. Importantly, this type of simultaneous testing allows for a determination of which chips 24 match up best with one another. This allows for optimization of the overall performance of specific matched sets as well as the overall performance of all the matched sets made from chips 24. In this embodiment, the matched sets will comprise two or more chips 24. For example, these matched sets may include multiple SRAM or DRAM components for use in a digital device, multiple amplifiers components for use in an analog device, multiple mixer, attenuator or circulator components for a RF device, multiple converter components for a mixed signal device and the like.

Figure 2:
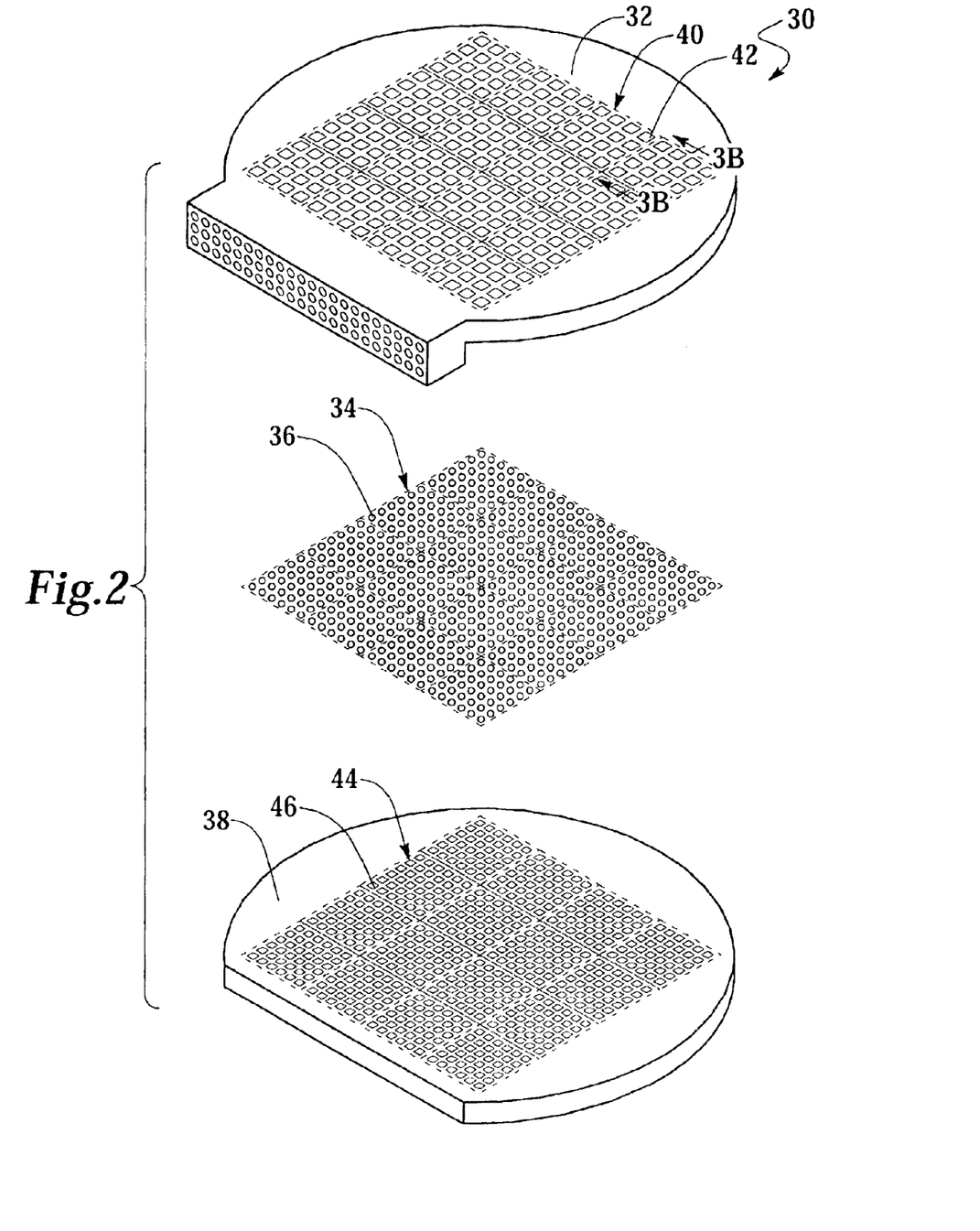
FIG. 2 is an exploded view of a wafer-interposer assembly of the present invention including a wafer having a plurality of chips.

Referring now to FIG. 2, therein is depicted a wafer-interposer assembly 30 of the present invention. Wafer-interposer assembly 30 includes a wafer interposer 32, an array 34 of conductive attachment elements 36 and a wafer 38. Interposer 32 has an array 40 of conductive contact pads 42 on the upper surface thereof. Array 40 is each split into sixteen sections separated by dotted lines which represent the locations where interposer 32 will be diced.

Each of the sixteen sections of array 40 has sixteen contact pads 42 depicted therein. The contact pads 42 represent the locations where interposer 32 will be electrically connected to a substrate once interposer 32 has been diced. On the lower surface of interposer 32 there is an array of conductive contact pads (not picture). In the illustrated embodiment, the contact pads on the lower surface of interposer 32 do not have the same geometry as contact pads 42, as will be explained in greater detail below.

Array 34 of conductive attachment elements 36 is split into sixteen sections separated by dotted lines. Each of the sections has thirty-six conductive attachment elements 36 that correspond to the contact pads on the lower surface of interposer 32.

Wafer 38 has a plurality of chips 44 depicted thereon having dotted lines therebetween that represent the locations where wafer 38 will be diced. Wafer 38 is depicted as having me sixteen chips 44. Each chip 44 has a plurality of conductive contact pads 46 on its face. Each chip 44 is depicted as having thirty-six contact pads 46, which correspond with the conductive attachment elements 36 in array 34 and represent the locations where chips 44 will be electrically connected to interposer 32.

Figure 3A:
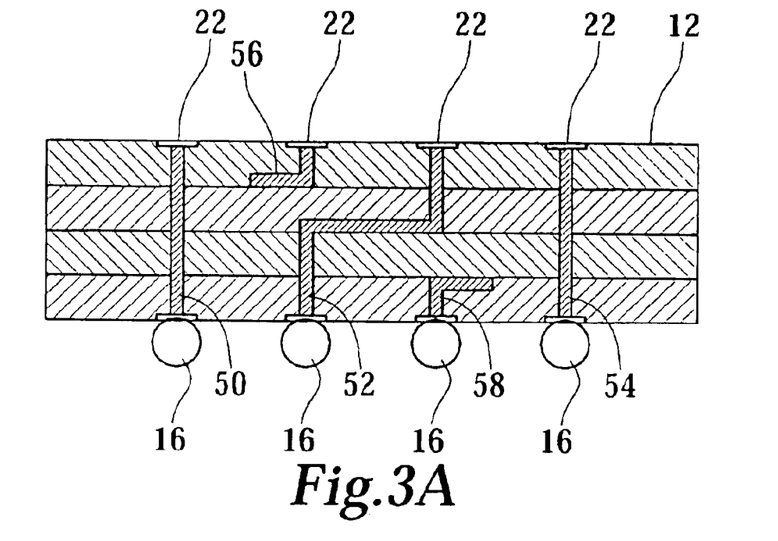
FIGS. 3A—3B are cross sectional views taken respectively along line 3A—3A of FIG. 1 and 3B—3B of FIG. 2.

Referring next to FIG. 3A a cross sectional view of interposer 12 taken along line 3A—3A of FIG. 1 is depicted wherein conductive attachment elements 16 have been attached thereto. Interposer 12 includes a plurality of layers having routing lines and vias therein which serve as electrical conductors. One set of conductors, depicted as conductors 50, 52, 54 and 56, pass through interposer 12 and serve to electrically connect pads 26 of chips 24 to the contact pads 22 of interposer 12. These conductors are selected to have suitable conductivity and may be, for example, aluminum or copper. Interposer 12 also includes a set of testing conductors, depicted as conductor 58, that pass through interposer 12 connecting some of the contact pads 26 of chips 24 to a testing apparatus as will be explained in greater detail below. The testing conductors may provide direct electrical connection to the testing apparatus or may pass through a multiplexer or other intervening apparatus (not shown) incorporated into interposer 12.

It can be seen that contact pads 26 of chips 24 and contact pads 22 of interposer 12 have identical geometries. The present invention, however, is by no means limited to having identical geometries. As each die design may have unique pad geometry, one of the advantages of the present invention is that the contact pads on the upper surface of an interposer may utilize a geometry that is different from that of the contact pads of the chips. Traditionally, chip designers have been limited in chip layout in that all of the I/O of a chip had to be made either through the peripheral edges of the chip (for wire bonding) or at least through a standard pin or pad layout defined by a standardization body, such as the Joint Electrical Dimensional Electronic Committee (JEDEC). The interconnection requirements, therefore, have traditionally driven the chip layout. Chip designs for use with an interposer of the present invention are not limited by such constraints.

Figure 3B:
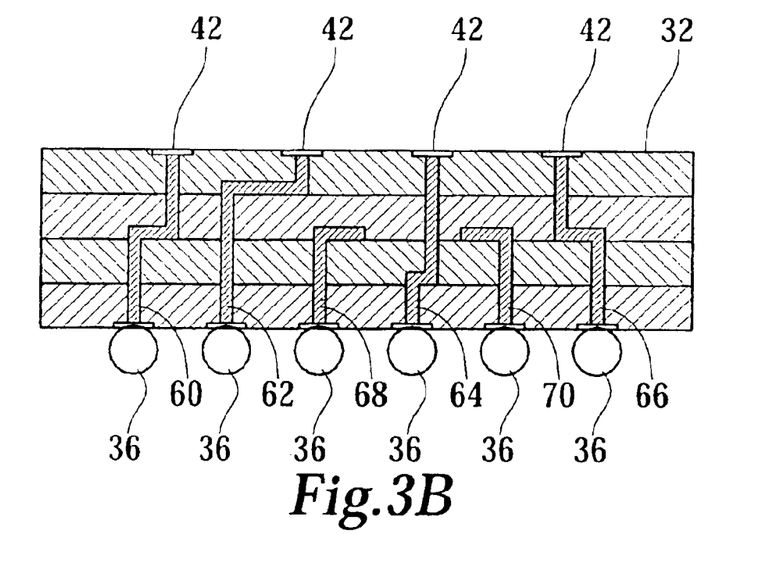

For example, as best seen in FIG. 3B, interposer 32, which has conductive attachment elements 36 attached thereto, includes a plurality of layers having routing lines and vias therein which serve as electrical conductors. One set of conductors, depicted as conductors 60, 62, 64 and 66 pass through interposer 32 to electrically connect contact pads 42 on the upper surface of interposer 32 to contact pads 46 on chips 44 (see FIG. 2). Another set of conductors, depicted as conductors 68 and 70, are testing conductors that pass through interposer 32 and are used to connect certain pads 46 of chips 44 (see FIG. 2) to a testing apparatus, as will be explained in greater detail below. As such, the geometry of pads 42 on the upper surface of interposer 32 is different from that of pads 46 on chips 44.

Figure 4:
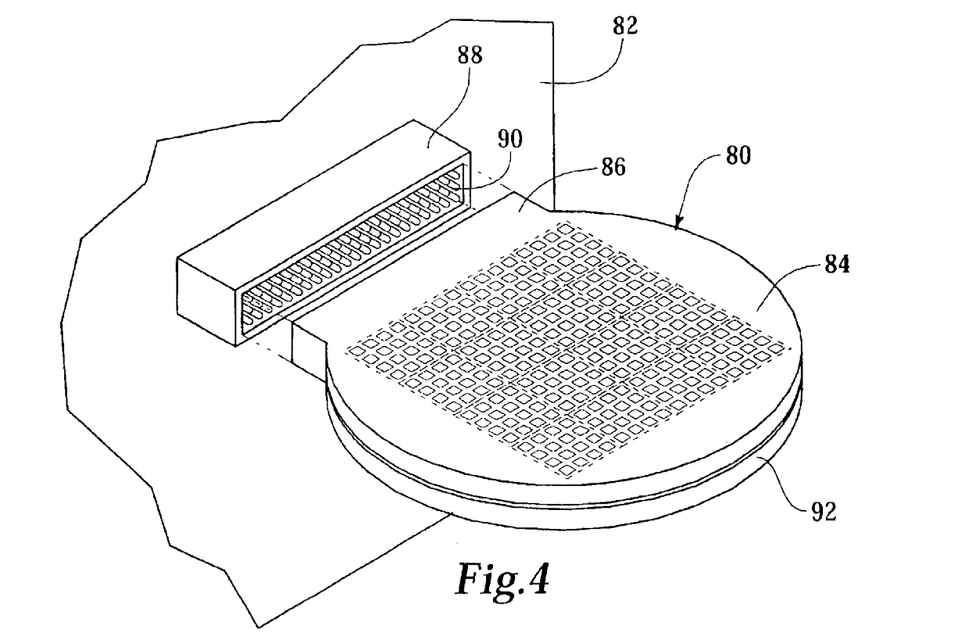
FIG. 4 is a partially exploded view of a wafer-interposer assembly of the present invention inserted into a testing apparatus.

Referring now to FIG. 4, therein is depicted a wafer-interposer assembly 80 connected to a testing unit 82. Wafer-interposer assembly 80 includes a wafer interposer 84 and a wafer 92. Wafer-interposer assembly 80 interfaces with testing unit 82 through a testing connector 88 that comprises a plurality of testing contacts 90, shown here as pins. The testing contacts 90 of testing connector 88 connect with the testing sockets of testing connector 86 of wafer-interposer assembly 80.

After electrical connection to the testing unit 82, wafer-interposer assembly 80 can be used to run the chips on wafer 92 through any number of tests including a complete parametric test, a burn-in or whatever subsets thereof are deemed necessary for that particular chip design. During the course of testing, signals may be sent to individual chips, groups of chips or all of the chips to test each function of the chips which may ideally occur across a range of conditions, so as to simulate real world operation. Testing unit 82 may incorporate a heating and cooling apparatus for testing the chips across a range of temperatures including burn-in testing. Testing unit 82 may also incorporate a device for vibrating or otherwise mechanically stressing the chips.

More specifically, wafer-interposer assemblies 80 of the present invention may be used to select chips from wafer 92 that will be used in a matched set of chips. For example, the testing may include performance tests over a range of temperatures, testing for leakage currents, testing for offset voltages, gain tracking, bandwidth and the like to determine which of the chips from wafer 92 could be included in a matched set with other chips from wafer 92 to achieve optimum performance. Alternatively, the testing may result in giving each of the chips a grade for speed or other performance characteristics such that chips of a particular grade may be matched with other chips of that same grade. Additionally, the testing may result in a non-conformance or mismatch determination wherein certain chips may not be matched with certain other chips. Certain chips may alternatively be designated as incompatible with any other chips.

Figure 5:
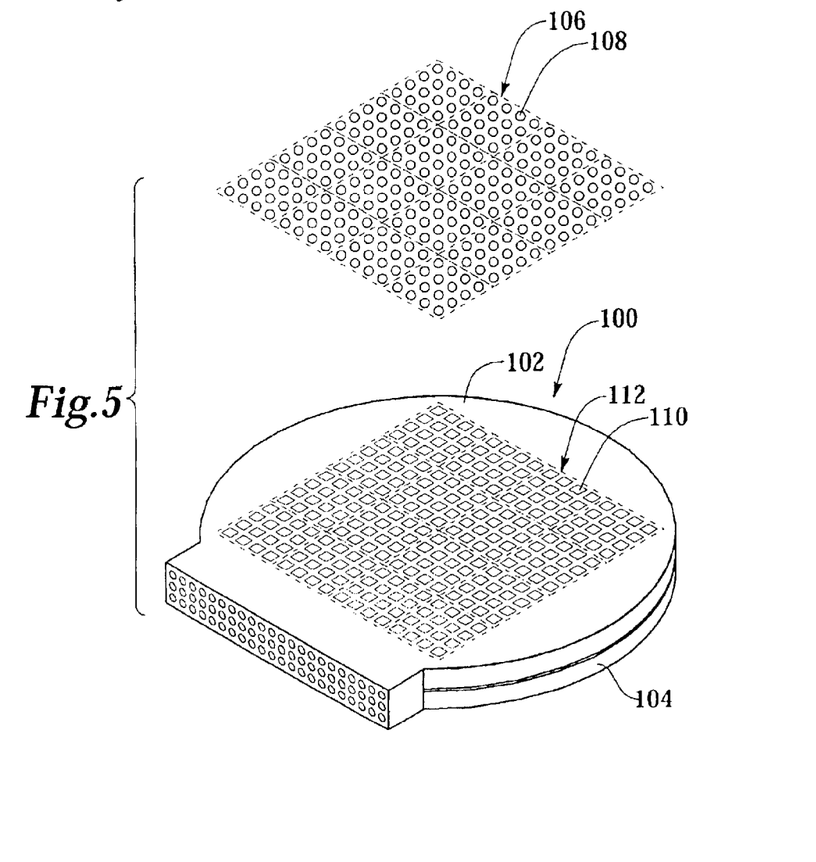
FIG. 5 is an exploded view of a wafer-interposer assemblies of the present invention.

Referring next to FIG. 5, a wafer-interposer assembly 100 is depicted including a wafer-interposer 102 and a wafer 104. Wafer-interposer assembly 100 also includes an array 106 of conductive attachment elements 108. Array 106 is split into sixteen sections separated by dotted lines. Each of the sections has sixteen conductive attachment elements 108 that correspond to contact pads 110 of array 112 on interposer 102.

After assembly, conductive attachment elements 108 will be used to electrically connect and mechanically bond a diced section of wafer-interposer assembly 100, including a section of interposer 102 and its associated chip from wafer 104 to a substrate, as will be explained in more detail below. These permanent electrical and mechanical connections may be achieved using, for example, a heating method such as reflowing or thermal compression.

Figure 6:
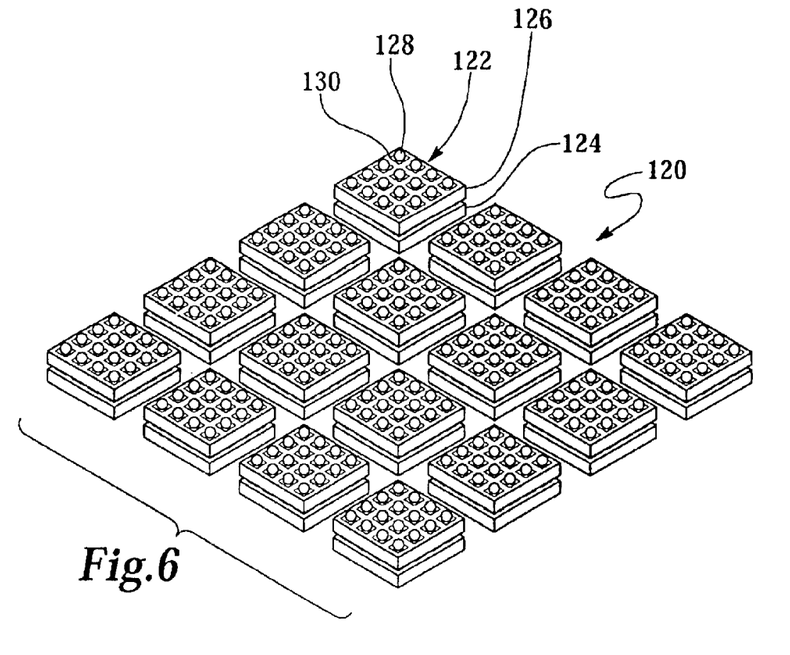
FIG. 6 is an isometric view of a plurality of chip assemblies after singulation of a wafer-interposer assembly of the present invention.

FIG. 6 shows an array 120 of chip assemblies 122 after singulation of a wafer-interposer assembly of the present invention. Each chip assembly 122 comprises a chip 124 from a wafer, a section 126 of an interposer and a plurality of conductive attachment elements 128 disposed on conductive contact pads 130 on the exposed surface of chip assemblies 122. Once chip assemblies 122 have been singulated, chip assemblies 122 may be sorted based upon the testing performed at the wafer level. For example, if chips 124 of chip assemblies 122 are filters for a radio frequency (RF) systems, the testing might have measured parameters such as insertion loss and phase shift as a function of the frequency, the input power and the temperature. The various chips 124 of chip assemblies 122 that are found to exhibit similar behavior when tested together may now be selected for inclusion in a matched set. Conversely, various chips 124 of chip assemblies 122 that are found to exhibit dissimilar or incompatible behavior when tested together will not be included in a matched set.

As will be understood by those skilled in the art, depending upon the type of components and the desired service to be performed by the matched set, an appropriate testing regiment will be designed to test the functionality of chips 124 that is critical to the desired performance of a matched set including chips 124. For example, the testing regiment may be designed to identify which chips 124 perform best together to allow for the assembly of high performance matched sets using high performing groups of chips 124, i.e., two or more chips 124, thereby maximizing the performance of a selected number of matched sets assembled from chip assemblies 122. Alternatively, a testing regiment may be designed to result in the grading of the performance of groups of chips 124 when tested together such that the performance of the lot of matched sets assembled using chip assemblies 122 may be maximized. As yet another alternative, a testing regiment may be designed to result in a finding of which chips 124 are compatible with each other such that those chips 124 may be included together as components in a matched set and which chips 124 are incompatible with each other and should not be included together as components in a matched set. Additionally, such a test regiment may identify certain chips 124 as being incompatible with any other chips 124 and should not be included in any matched set. Additionally, it should be noted by those skilled in the art that any effects of the interposer on the testing of the chips are inherently taken into account during testing as the interposer and the wafer are diced together such that a section of the interposer and a chip remain together as will be explained in greater detail below.

Figure 7:
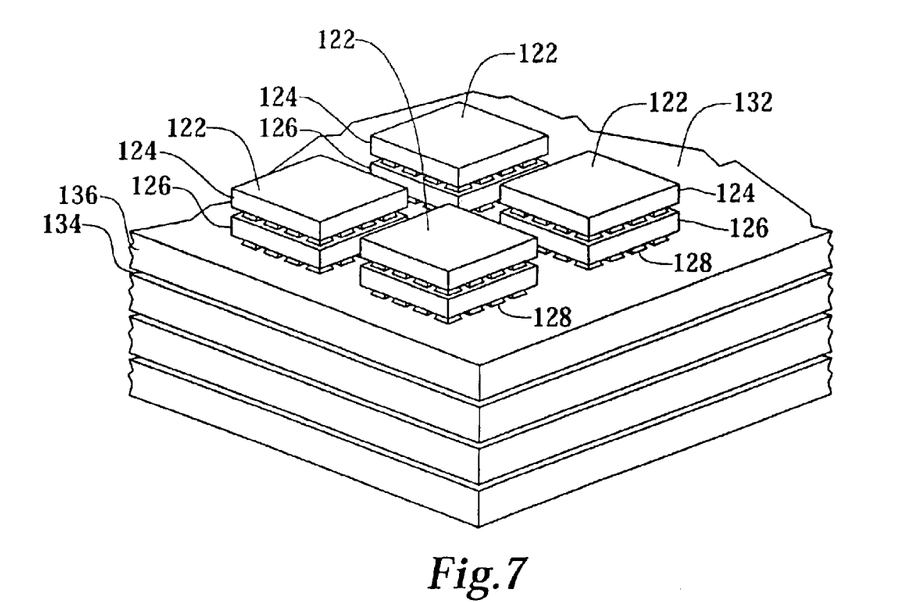
FIG. 7 is an isometric view of a matched set of chip assemblies of the present invention in place on a substrate.

As best seen in FIG. 7, several chip assemblies 122 may be mounted together on a substrate 132 as a matched set. Substrate 132 has a plurality of conductive layers 134 and dielectric layers 136. Chip assemblies 122 are electrically and mechanically attached to contact pads on the surface of substrate 132 through conductive attachment elements 128. Assembled as shown, the diced sections 126 of the interposer provide electrical connection between chips 124 and substrate 132. In certain embodiments, substrate 132 may be a traditional FR4 circuit board. Alternatively, substrate 132 may be composed of a higher grade material such as a ceramic, which is typically used in multichip packages.

While FIG. 7 has depicted a matched set of component as including four chip assemblies 122, it should be understood by those skilled in the art that any number of chip assemblies may be utilized in such a matched set. The specific number of chip assemblies will be selected based upon the desired functionality of the matched set. The testing process of the present invention provides for each of the components of a matched set, regardless of the number, to be tested together as part of a single testing procedure. As such, the components for the matched sets are selected for assembly only after successful testing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for selecting components for a matched set comprising the steps of:
   electrically and mechanically coupling a semiconductor wafer having a plurality of integrated circuit chips to an interposer to form a wafer-interposer assembly;
   simultaneously testing at least two of the integrated circuit chips of the semiconductor wafer to determine inclusion in the matched set;
   dicing the wafer-interposer assembly into a plurality of chip assemblies; and
   selecting at least two of the chip assemblies corresponding to the at least two of the integrated circuit chips determined for inclusion in the matched set based upon the simultaneous testing.

2. The method as recited in claim 1 wherein the step of simultaneously testing at least two of the integrated circuit chips further comprises simultaneously testing groups of the integrated circuit chips together to identify which groups of integrated circuit chips perform best together for inclusion in a selected number of high performance matched sets.

3. The method as recited in claim 1 wherein the step of simultaneously testing at least two of the integrated circuit chips further comprises simultaneously testing groups of integrated circuit chips together to grade the groups of integrated circuit chips for performance such that the overall performance of matched sets assembled from the chip assemblies is maximized.

4. The method as recited in claim 1 wherein the step of simultaneously testing at least two of the integrated circuit chips further comprises simultaneously testing groups of the integrated circuit chips together to identify the compatibility of individual integrated circuit chips with one another.

5. The method as recited in claim 1 wherein the step of simultaneously testing at least two of the integrated circuit chips further comprises simultaneously testing groups of the integrated circuit chips together to identify which individual integrated circuit chips are incompatible with one another.

6. The method as recited in claim 1 wherein the step of simultaneously testing at least two of the integrated circuit chips further comprises simultaneously testing the at least two of the integrated circuit chips for performance over a range of temperatures.

7. The method as recited in claim 1 wherein the step of simultaneously testing at least two of the integrated circuit chips further comprises simultaneously performing burn-in testing of the at least two of the integrated circuit chips.

8. The method as recited in claim 1 wherein the step of simultaneously testing at least two of the integrated circuit chips further comprises simultaneously vibrating the at least two of the integrated circuit chips.

9. The method as recited in claim 1 wherein the step of simultaneously testing at least two of the integrated circuit chips further comprises simultaneously testing the at least two of the integrated circuit chips for leakage currents.

10. The method as recited in claim 1 wherein the step of simultaneously testing at least two of the integrated circuit chips further comprises simultaneously testing the at least two of the integrated circuit chips for offset voltages.

11. The method as recited in claim 1 wherein the step of simultaneously testing at least two of the integrated circuit chips further comprises simultaneously testing the at least two of the integrated circuit chips for gain tracking.

12. The method as recited in claim 1 wherein the step of simultaneously testing at least two of the integrated circuit chips further comprises simultaneously testing the at least two of the integrated circuit chips for bandwidth.

13. The method as recited in claim 1 wherein the step of simultaneously testing at least two of the integrated circuit chips further comprises simultaneously testing the at least two of the integrated circuit chips for speed grades.

14. The method as recited in claim 1 wherein the integrated circuit chips of the semiconductor wafer are digital devices.

15. The method as recited in claim 1 wherein the integrated circuit chips of the semiconductor wafer are analog devices.

16. The method as recited in claim 1 wherein the integrated circuit chips of the semiconductor wafer are RF devices.

17. The method as recited in claim 1 wherein the integrated circuit chips of the semiconductor wafer are mixed signal devices.

18. A matched set assembled by the method as recited in claim 1.

19. A method for assembling a matched set comprising the steps of:
   providing a semiconductor wafer having a plurality of integrated circuit chips;
   electrically and mechanically coupling the wafer to an interposer to form a wafer-interposer assembly;
   simultaneously testing pairs of the integrated circuit chips of the wafer to determine inclusion in the matched set;
   dicing the wafer-interposer assembly into a plurality of chip assemblies;
   sorting the chip assemblies based upon the inclusion determinations performed during the simultaneous testing of the pairs of the integrated circuit chips; and
   electrically coupling at least two of the chip assemblies corresponding to a sorted pair of the integrated circuit chip onto a substrate, thereby assembling the matched set.

20. The method as recited in claim 19 wherein the step of simultaneously testing pairs of the integrated circuit chips further comprises simultaneously testing groups of the integrated circuit chips together to identify which groups of integrated circuit chips perform best together for inclusion in a selected number of high performance matched sets.

21. The method as recited in claim 19 wherein the step of simultaneously testing pairs of the integrated circuit chips further comprises simultaneously testing groups of integrated circuit chips together to grade the groups of integrated circuit chips for performance such that the overall performance of matched sets assembled from the chip assemblies is maximized.

22. The method as recited in claim 19 wherein the step of simultaneously testing pairs of the integrated circuit chips further comprises simultaneously testing groups of the integrated circuit chips together to identity the compatibility of individual integrated circuit chips with one another.

23. The method as recited in claim 19 wherein the step of simultaneously testing pairs of the integrated circuit chips further comprises simultaneously testing groups of the integrated circuit chips together to identify which individual integrated circuit chips are incompatible with one another.

24. The method as recited in claim 19 wherein the step of simultaneously testing pairs of the integrated circuit chips further comprises simultaneously testing the pairs of the integrated circuit chips for performance over a range of temperatures.

25. The method as recited in claim 19 wherein the step of simultaneously testing pairs of the integrated circuit chips further comprises simultaneously performing burn-in testing of the pairs of the integrated circuit chips.

26. The method as recited in claim 19 wherein the step of simultaneously testing pairs of the integrated circuit chips further comprises simultaneously vibrating the pairs of the integrated circuit chips.

27. The method as recited in claim 19 wherein the step of simultaneously testing pairs of the integrated circuit chips further comprises simultaneously testing the pairs of the integrated circuit chips for leakage currents.

28. The method as recited in claim 19 wherein the step of simultaneously testing pairs of the integrated circuit chips further comprises simultaneously testing the pairs of the integrated circuit chips for offset voltages.

29. The method as recited in claim 19 wherein the step of simultaneously testing pairs of the integrated circuit chips further comprises simultaneously testing the pairs of the integrated circuit chips for gain tracking.

30. The method as recited in claim 19 wherein the step of simultaneously testing pairs of the integrated circuit chips further comprises simultaneously testing the pairs of the integrated circuit chips for bandwidth.

31. The method as recited in claim 19 wherein the step of simultaneously testing pairs of the integrated circuit chips further comprises simultaneously testing the pairs of the integrated circuit chips for speed grades.

32. The method as recited in claim 19 wherein the integrated circuit chips of the semiconductor wafer are digital devices.

33. The method as recited in claim 19 wherein the integrated circuit chips of the semiconductor wafer analog devices.

34. The method as recited in claim 19 wherein the integrated circuit chips of the semiconductor wafer mixed signal devices.

35. The method as recited in claim 19 wherein the integrated circuit chips of the semiconductor wafer are RF devices.

36. A matched set assembled by the method as recited in claim 19.

37. A matched set of integrated circuit chips comprising:
   a first chip assembly diced from a wafer-interposer assembly, the first chip assembly including a first integrated circuit chip from a wafer;
   a second chip assembly diced from the wafer-interposer assembly, the second chip assembly including a second integrated circuit chip from the wafer, the first and second integrated circuit chips being previously simultaneously tested to determine inclusion in the matched set as part of the wafer-interposer assembly, wherein the first and second integrated circuit chips are selected from the group consisting of digital devices, analog devices, RF devices and mixed signal devices; and a substrate on to which the first and second chip assemblies are electrically coupled.

38. The matched set as recited in claim 37 further comprising a third chip assembly diced from the wafer-interposer assembly, the third chip assembly including a third integrated circuit chip from the wafer, the first, second and third integrated circuit chips being previously simultaneously tested as part of the wafer-interposer assembly, the third chip assembly electrically coupled to the substrate.

* * * * *